United States Patent
Kawae et al.

(10) Patent No.: US 7,906,904 B2
(45) Date of Patent: Mar. 15, 2011

(54) LIGHT PERMEABLE FLUORESCENT COVER FOR LIGHT EMITTING DIODE

(75) Inventors: Hiroyuki Kawae, Niiza (JP); Takeshi Sano, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 10/026,871

(22) Filed: Dec. 21, 2001

(65) Prior Publication Data
US 2002/0080501 A1   Jun. 27, 2002

Related U.S. Application Data

(63) Continuation-in-part of application No. 09/597,038, filed on Jun. 20, 2000, now Pat. No. 6,472,765.

(30) Foreign Application Priority Data

Dec. 22, 2000   (JP) .................................. 2000-391457

(51) Int. Cl.
*H01J 1/62* (2006.01)
*H01J 63/04* (2006.01)
(52) U.S. Cl. ..................... 313/512; 313/498; 313/503
(58) Field of Classification Search .......... 313/498–512; 257/787, 95, 88, 98–100; 438/22, 25, 26, 438/27, 29; 362/311.14, 230, 231, 293
See application file for complete search history.

(56) References Cited

U.S. PATENT DOCUMENTS

| | | | | |
|---|---|---|---|---|
| 5,959,316 A | * | 9/1999 | Lowery | 257/98 |
| 5,962,971 A | * | 10/1999 | Chen | 313/512 |
| 5,998,925 A | * | 12/1999 | Shimizu et al. | 313/503 |
| 6,066,861 A | | 5/2000 | Hohn et al. | |
| 6,252,254 B1 | * | 6/2001 | Soules et al. | 257/89 |
| 6,340,824 B1 | * | 1/2002 | Komoto et al. | 257/99 |
| 6,414,426 B1 | * | 7/2002 | Akashi et al. | 313/486 |
| 6,459,197 B1 | * | 10/2002 | Mori et al. | 313/487 |
| 6,472,765 B1 | * | 10/2002 | Sano et al. | 257/787 |

FOREIGN PATENT DOCUMENTS

| | | |
|---|---|---|
| EP | 1 013 740 | 6/2000 |
| EP | 1 045 458 | 10/2000 |
| GB | 2 039 517 | 8/1980 |
| JP | 4239588 | 8/1992 |
| JP | 10200165 A * | 7/1998 |
| JP | 2000022216 A * | 1/2000 |
| JP | 2002118292 | 4/2002 |
| WO | WO 98/00679 | 2/1998 |
| WO | WO 00/33390 | 6/2000 |

* cited by examiner

*Primary Examiner* — Karabi Guharay
*Assistant Examiner* — Kevin Quarterman
(74) *Attorney, Agent, or Firm* — Bachman & LaPointe, P.C.

(57) ABSTRACT

A light permeable fluorescent cover 6 is provided that comprises a fluorescent material 7 contained in the cover 6 attached on a light emitting diode for emitting a first light with a first peak in blue wavelength range of 420 nm to 480 nm. The fluorescent material 7 emits a second light with a second peak in green wavelength range of 480 nm to 580 nm separated from the first peak and a third light with a third peak in red wavelength range of 580 nm to 750 nm separated from the second peak to synthesize lights in a wide chromaticity area by mixing three primary blue, green and red lights and to irradiate them to outside of the cover 6 in colorful expression.

8 Claims, 8 Drawing Sheets

Relation of Manganic Concentration and Luminous Color

Fig.4

Chromaticity Diagram of Light Eimitting Device
with La Aluminate:Manganese Fluorescent Material

Fig. 11 Prior Art — Excitation Spectrum of YAG:Ce Fluorescent Material

Fig. 12 Prior Art — Emission Spectrum of YAG:Ce Fluorescent Material

Fig. 13 Prior Art — Emission Spectrum of Light Emitting Device with Prior Art Light Permeable Fluorescent Cover Emission Spectrum of Cold Cathode Fluorescent Tube

*Fig. 14 Prior Art*

Transmission Spectrum of Color Filter
for Transmission Color Liquid Crystal Display

LIGHT PERMEABLE FLUORESCENT COVER FOR LIGHT EMITTING DIODE

CROSS-REFERENCE TO RELATED APPLICATION

The instant application is a continuation-in-part of U.S. application Ser. No. 09/597,038 filed Jun. 20, 2000 and which issued on Oct. 29, 2002 as U.S. Pat. No. 6,472,765.

BACKGROUND OF THE INVENTION

1. Field of the Invention

The present invention relates to a fluorescent cover, in particular a light permeable fluorescent cover attached on a light emitting diode for irradiating out of the cover lights of different wavelengths from wavelength of light emitted from the diode.

2. Description of the Prior Art

For example, U.S. patent application Ser. No. 09/597,038 discloses a plastic encapsulated semiconductor light emitting device which comprises a plurality of leads, one of which is formed with a dished portion; a semiconductor light emitting element attached on a bottom surface of the dished portion for electrical connection of the light emitting element across the leads; a plastic encapsulant for sealing each end of the leads and semiconductor light emitting element; a light-permeating cover attached to an outer surface of the plastic encapsulant; and fluorescent particles contained in the cover. In this device, the semiconductor light emitting element produces a blue light that is emanated through the plastic encapsulant and reaches the fluorescent particles in the cover to activate or excite the fluorescent particles for wavelength-conversion of light emitted from the semiconductor light emitting element. As a result, the fluorescent particles generate from the cover a white light with its wavelength different from that of light from the semiconductor light emitting element. However, this light emitting device is defective in that it cannot produce a light of the satisfactory coloring balance with less amount of red component in the light.

An object of the present invention is to provide a light permeable fluorescent cover attached on a light emitting diode suitable for a display that requires sharp emission spectra or excellent colorific balance such as a transmission color liquid crystal display or a backlighting device. Another object of the present invention is to provide a light permeable fluorescent cover attached on a light emitting diode suitable for a display that requires excellent colorific balance such as a supplementary light source for a reflection color liquid crystal display. A still another object of the present invention is to provide a light permeable fluorescent cover attached on a light emitting diode for producing an eye-friendly light conformable to human physiology. A further object of the present invention is to provide a light permeable fluorescent cover attached on a light emitting diode for producing a light with the colorific tone for covering a wider chromatic area. A still further object of the present invention is to provide a light permeable fluorescent cover made at reduced cost with good quality for a light emitting diode.

SUMMARY OF THE INVENTION

A light permeable fluorescent cover according to the present invention is attached on a light emitting diode (LED) which emits a first light having a first peak in a first wavelength range. The cover comprises a fluorescent material for producing second and third lights upon excitation by the first light from the LED. The second light has a second peak in a second wavelength range away from the first peak, and the third light has a third peak in a third wavelength range away from the first and second peaks to mix the first, second and third lights into a synthesized new light in a wide chromatic area or with colorific tone or balance similar to sunlight.

BRIEF DESCRIPTION OF THE DRAWINGS

Preferred embodiments of the present invention will be described with reference to the accompanying drawings in which.

DETAILED DESCRIPTION OF THE PREFERRED EMBODIMENTS

Figure 9:
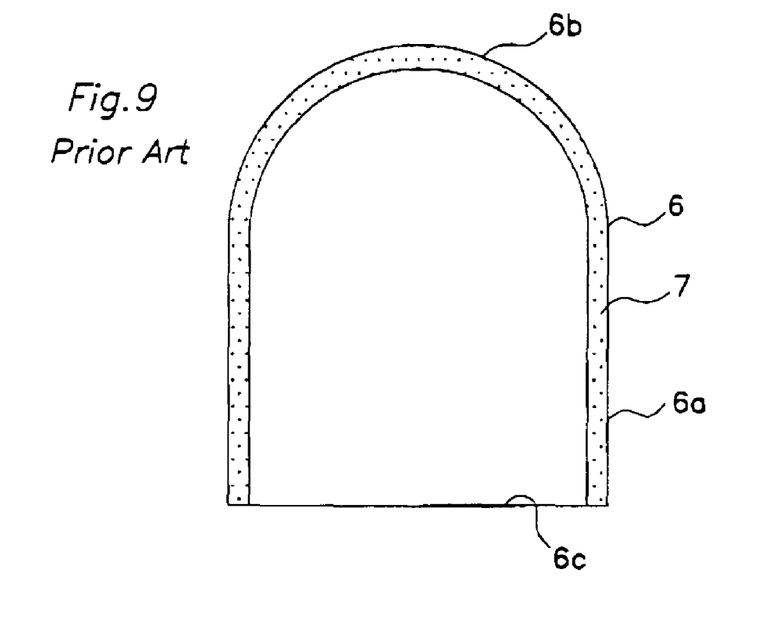
FIG. 9 is a sectional view of a prior art light permeable fluorescent cover.

FIG. 9 shows a sectional view of a prior art light permeable fluorescent cover attached on an LED for light wavelength conversion. The light permeable fluorescent cover 6 comprises a light permeable base material selected from epoxy resin, urea resin or silicone, and a fluorescent powdery material contained in the base material. For example, fluorescent material is blended in silicone resin gel to prepare a plastic melt mixture that is injected into a metallic mold cavity of complementary shape to profile of LED to form fluorescent cover 6. The fluorescent material blended in cover 6 includes organic or inorganic fluorescent substance such as organic fluorescent pigment, and LED capped with cover 6 may be of a gallium nitride semiconductor capable of giving off a blue light effective in optical excitation of fluorescent material for wavelength conversion. When LED generates a blue light or ultraviolet rays to fluorescent cover 6, organic fluorescent material deteriorates in a short period of time by emitted light, and therefore preferable fluorescent materials should be inorganic substances such as yttrium aluminum garnet (YAG) fluorescent material 7 activated by cerium (Ce) (hereinafter referred to as "YAG:Ce fluorescent material").

Figure 10:
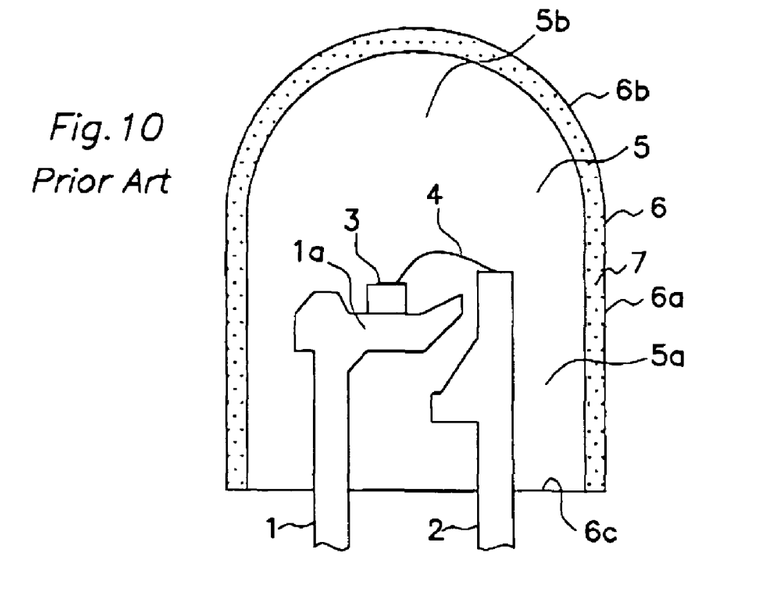
FIG. 10 is a sectional view of an LED capped with the prior art light permeable fluorescent cover.

A prior art LED shown in FIG. 10 comprises a first conductor 1 as a cathode lead; a second conductor 2 as an anode lead; an LED chip 3 of gallium nitride compound mounted on a dished portion or concavity 1a at a top of first conductor 1; a lead wire 4 electrically connected between an electrode not shown in FIG. 10 of LED chip 3 and a top of second conductor 2; a light permeable encapsulant 5 for sealing an upper parts of first and second conductors 1, 2, LED chip 3 and lead wire 4; and a fluorescent cover 6 attached on encapsulant 5. The encapsulant 5 comprises a lower cylindrical potion 5a and an upper spherical potion 5b integrally formed on cylindrical potion 5a. The fluorescent cover 6 comprises a cylindrical potion 6a for defining a cavity of its shape complementary to cylindrical potion 5a of encapsulant 5, and a spherical potion 6b for defining a cavity of its shape complementary to spherical potion 5b of encapsulant 5 above cylindrical potion 6a. The encapsulant 5 can be inserted from an opening 6c formed at bottom of cover 6 into cylindrical and spherical cavities of cover 6 to attach it on external surface of encapsulant 5 so that cover 6 is attached in tight and clinging relation to encapsulant 5 to prevent easy detachment of cover 6 from encapsulant 5 under external force such as vibration applied to cover 6.

Figure 11:
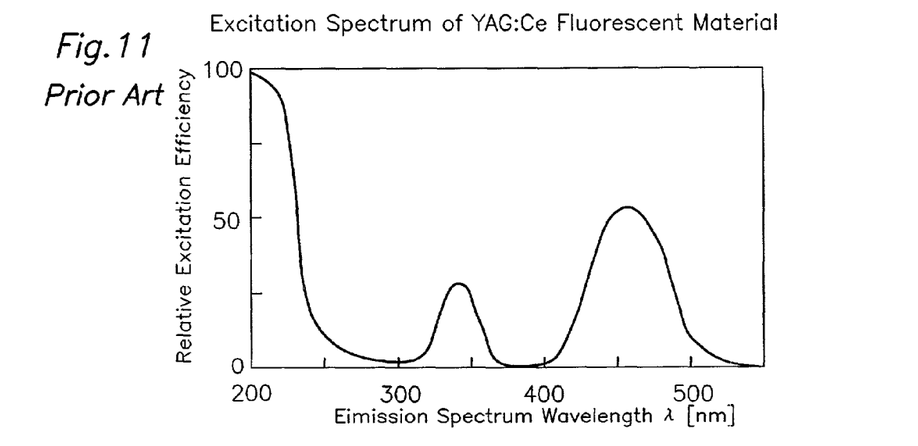
FIG. 11 is a graph showing relative excitation efficiency of a YAG:Ce fluorescent material relative to excitation spectrum wavelength.
Figure 12:
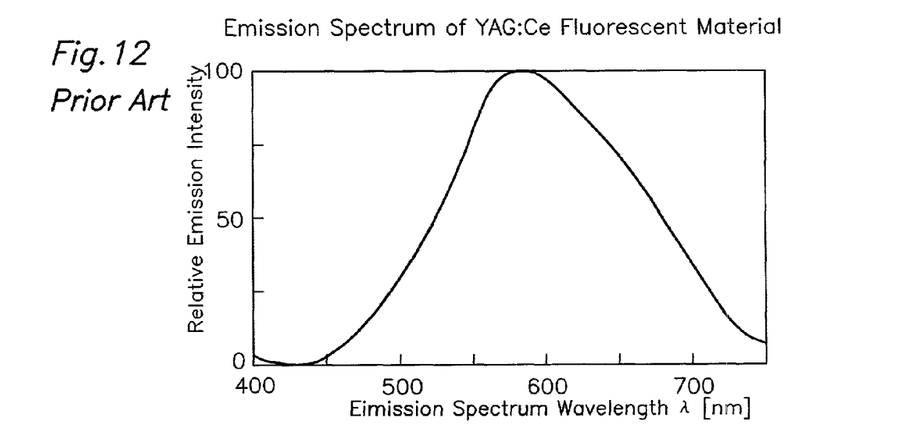
FIG. 12 is a graph showing relative emission intensity of light from a YAG:Ce fluorescent material.
Figure 13:
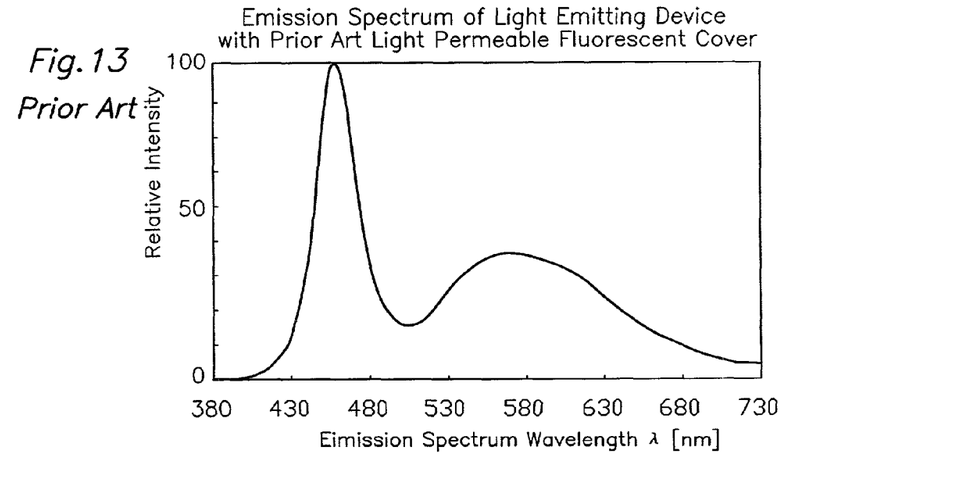
FIG. 13 is a graph showing relative intensity of light from an LED capped with a prior art light permeable fluorescent cover relative to excitation spectrum wavelength.

FIGS. 11 and 12 respectively show excitation and emission spectra of YAG:Ce fluorescent material, and FIG. 13 shows an emission spectrum of blue LED covered with a prior art light permeable fluorescent cover with YAG:Ce fluorescent material. When chip 3 radiates blue light, a part of blue light passes through base material of fluorescent cover 6 to outside without impingement to fluorescent material 7 contained in cover 6, however, another part of blue light hits and excites fluorescent material 7 to emit yellow light after wavelength conversion by fluorescent material 7. The blue and yellow lights are optically complementary colors that when mixed are converted into a white light emitted to outside of cover 6.

This prior art LED for emitting white light has a superior feature of higher mechanical shock resistance, and is advantageous in that it can be operated under less applied voltage, less power consumption, less amount of generated heat, and is eco-friendly without incidental high frequency noise and use of mercury as compared with incandescent lamps, and hot and cold cathode fluorescent tubes of prior art bulb type white light sources.

However, prior art light emitting device has various defects and restrictions in manufacture and application. A first problem of the device is that it cannot generate a bright luminescent color with degraded chromatic purity when it is used as a white backlighting source for a display, such as a transmission color liquid crystal display which requires sharp emission spectrum.

Figure 14:
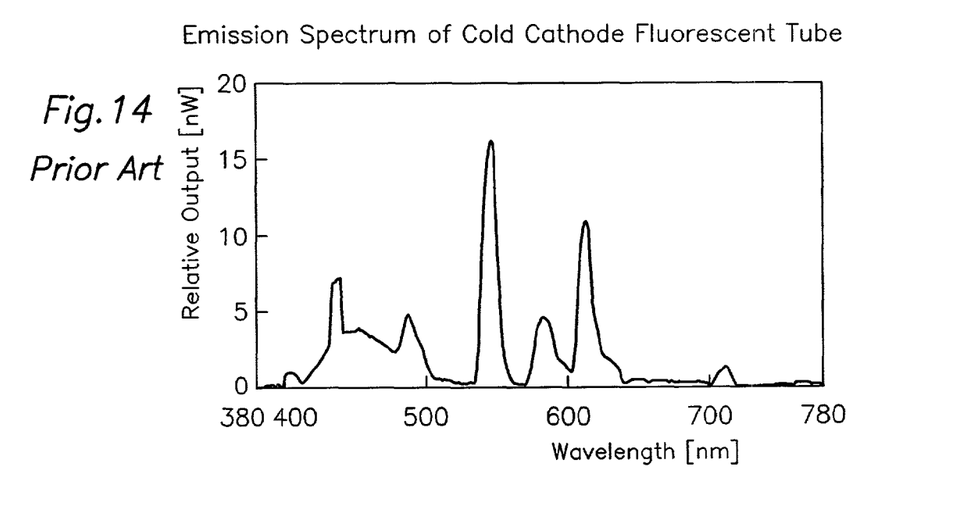
FIG. 14 is a graph showing an example of relative output from a cold cathode fluorescent tube.
Figure 15:
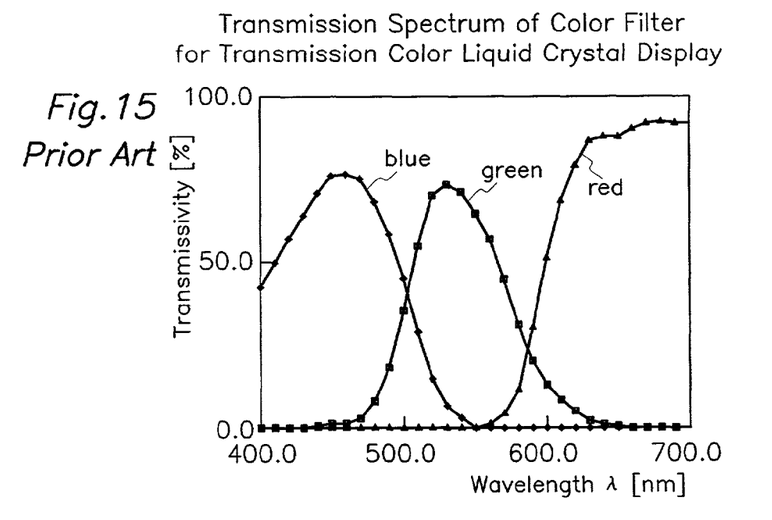
FIG. 15 is a graph showing transmissivity of a color filter for a transmission color liquid crystal display.

A typical backlighting means of a transmission color liquid crystal display, includes a cold cathode fluorescent tube of three light wavelengths provided with three light sources disposed away from each other to produce blue, green and red lights with three light emission spectra. FIG. 14 shows an example of sharp blue, green and red peaks in emission spectra produced by a typical cold cathode fluorescent tube of three light wavelengths. FIG. 15 shows transmission spectra of wide bands through blue, green and red filters to form three primary color pixels in transmission color liquid crystal display. In the display, transmission spectra of each pixel are essentially determined by corresponding emission spectra of cold cathode fluorescent tube of three wavelengths so that the display can hardly indicate optical colors with high chromatic purity only by transmission property through color filters since the filters merely serve to filter lights in undefined and rough ranges in order to prevent mixture of transmission spectra among primary color components, namely, red, green and blue.

When LED shown in FIG. 10 is used with cover of YAG:Ce fluorescent material, the cover generates a light of emission spectrum in a divergent wavelength band as shown in FIG. 13, as the cover produces an emission spectrum of wider wavelength as shown in FIG. 12. Accordingly, in transmission color liquid crystal display with a prior art light emitting device, transmission spectrum of each pixel must be determined by transmission spectrum through color filter. In any event, the light emitting device is unsuitable as a backlighting means of transmission color liquid crystal display since it cannot represent bright colors with deteriorated chromatic purity.

A second problem of the light emitting device is that it produces a light with less amount of red component, and therefore, it cannot perform color indication with satisfactory coloring balance for example in a supplementary light source of reflection color liquid crystal display. With recent development of information and communication technology, there have been utilized many reflection color liquid crystal indicators in mobile devices such as mobile phones, personal handy phone systems, personal digital assistants and notebook personal computers. Unlike transmission color liquid crystal display, reflection color liquid crystal display performs coloring indication, utilizing external reflected light such as sunlight irradiated on a surface of the display, however it is disadvantageous in that it cannot be operated in dark area without external light. Therefore, reflection color liquid crystal display requires a supplementary light source (a front light) provided therein for producing a white light to operate it in dark area. If prior art light emitting device is adopted as a supplementary light source for reflection color liquid crystal display, the light source will produce a light with less amount of red component as shown in FIG. 13, because the light emitting device originally produces an emission spectrum of wider wavelength with less amount of red component as shown in FIG. 12.

Balance of colorific tone in reflection color liquid crystal display is generally designed based on sunlight spectra obtained as a typical external light source so that the display provides a substantially homogenized color tone on whole display screen under sunlight with much amount of red component. However, prior art light emitting device cannot be used as supplementary light source for the display, because light generated from the device includes less amount of red component, and therefore, when supplementary light source is turned on in dark place, it disadvantageously exhibits reddish color in dark tone with unbalanced color tone on whole display screen compared to external light.

A third problem of prior art light emitting device is that it makes watcher's eyes tired when he or she keeps watching a display screen of the device because it generates two lights in an optically complementary color relation, specifically blue light given off from LED chip and a yellow light sent out from YAG:Ce fluorescent material 7.

A report of study on cerebrum physiology indicates that lights in optically complementary color relation, for example a combination of blue and yellow lights form a strong afterimage on viewer's optic nerve and promote asthenopia of his or her eyes when he or she continues watching display screen. Accordingly, it is apparent that eyes would be exhausted by visual activity such as reading for a long time under lights in optically complementary color relation of prior art light emitting device. Then, the third problem would be unavoidable if optically complementary color lights are mixed into a white light as in prior art light emitting device.

Moreover, a forth problem of the device arises that it cannot synthesize lights in various color tones by mixing blue and yellow lights from LED chip and YAG:Ce fluorescent material 7 because it generates synthesized lights only in an extremely narrower chromatic range.

In a theory of color mixing optics, two lights a and b of different wavelengths are indicated respectively as points (xa, ya) and (xb, yb) in a chromaticity diagram. When lights a and b are mixed, a synthesized light is indicated as a point (xm, ym) that lies in a straight line connecting between two points (xa, ya) and (xb, yb), and position (xm, ym) of synthesized light in chromaticity diagram is determined by relative intensity of two lights a and b. Specifically, position (xm, ym) is plotted in diagram near point (xa, ya) or (xb, yb) depending on whether light a or b is more intensive.

Figure 16:
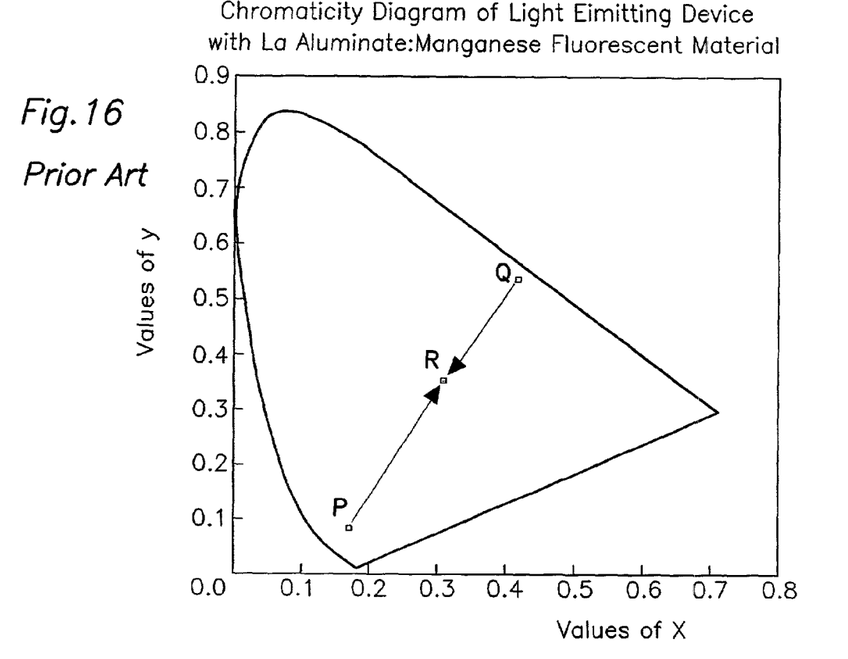
FIG. 16 is a chromaticity diagram of lights irradiated from a prior art light permeable fluorescent cover capped on an LED

FIG. 16 shows a locus in standard diagram of a synthesized color provided by prior art light emitting device wherein points P, Q and R represent respectively chromatic locations of blue LED light, a fluorescent light from YAG:Ce and a mixed light. This diagram can be directly applied to prior art light emitting device which comprises an LED for producing blue light; and YAG:Ce fluorescent material for converting blue light from LED into yellow light of different wavelength to irradiate a mixed light of blue and yellow lights outside of the device. The mixed light is represented by point R that should lie only on a straight line connecting between points P and Q so that the mixed light is restricted in an extremely narrower chromatic range.

Various attempts have been made to improve chromatic range of a synthesized light by generally adding other elements to a YAG matrix of YAG:Ce fluorescent material to change YAG components and thereby shift wavelength of luminescence from fluorescent material to a different wavelength. For example, gallium or gadolinium can be doped in fluorescent material 7 to shift output light to a shorter or longer wavelength side. However, an excessive amount or high concentration of doped gallium causes reduction in light emitting efficiency, and an excessive amount or high concentration of doped gadolinium results in promotion of "temperature quenching" that decreases light emitting efficiency with temperature elevation. In any event, YAG components can be adjusted only in a practically restricted range as the foregoing attempts may bring about deterioration of the important optical features in the device.

Figure 17:
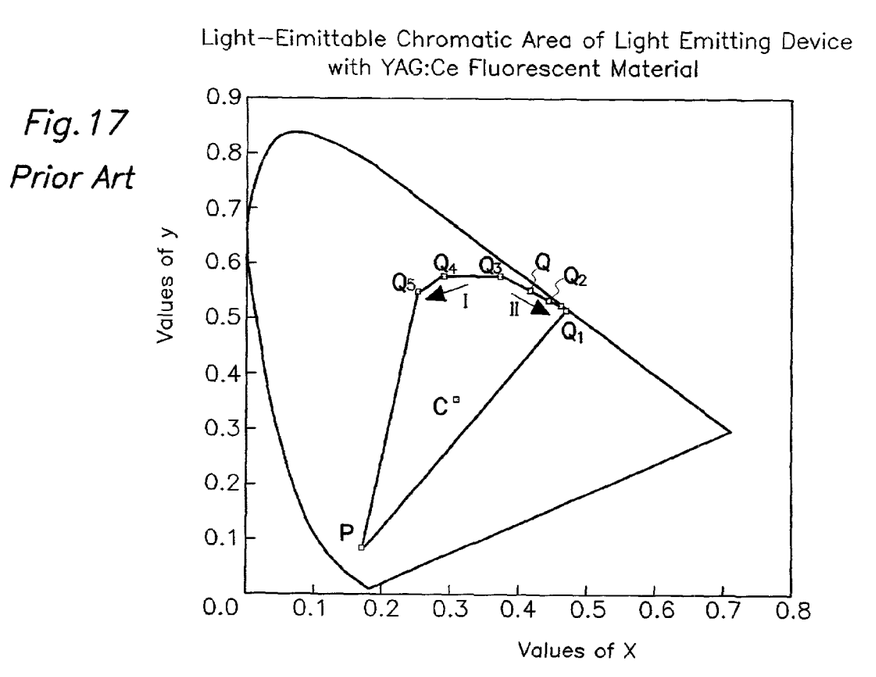
FIG. 17 is a chromaticity diagram indicating a light-emittable chromatic area of a prior art light permeable fluorescent cover attached on an LED.

FIG. 17 illustrates a light-emittable chromatic area surrounded by a substantially triangular profile or sector "P-$Q_1$-$Q_2$-Q-$Q_3$-$Q_4$-$Q_5$-P" that is attained by addition of gallium and gadolinium to YAG components in prior art light emitting device. In FIG. 17, "I" indicates an increase direction of gallium additive amount; "II" refers to an increase direction of gadolinium additive amount; and a point "C" represents a locus of pure white. In this way, light-emittable chromatic area of prior art device is restricted in narrow sector although specific additives are doped in fluorescent material 7.

Embodiments will be described hereinafter in reference to FIGS. 1 to 6 regarding the light permeable fluorescent cover according to the present invention to be laid over an LED.

The light permeable fluorescent cover according to the present invention may have the shape in section similar to that of prior art fluorescent cover shown in FIGS. 9 and 10. In the embodiment of the invention, LED chip 3 produces blue light with a first peak in a wavelength band of 420 nm to 480 nm. Contained in cover 6 according to the present invention is lanthanoid aluminate-manganese fluorescent material 7 excited by blue light from LED chip 3 to emit green and red lights as second and third lights with respectively second and third peaks in wavelength bands 480 nm to 580 nm and 580 nm to 750 nm. Accordingly, three monochromatic lights with three independent or different spectra are irradiated from cover 6 to outside to produce synthesized lights of different colors by mixture of these monochromatic lights. The fluorescent material 7 contains lanthanoid aluminate-manganese activated by manganese shown by for example one selected from chemical formulae: $LaAl_{11}O_{18}:Mn^{2+}$ and $La_2O_3 11Al_2O_3:Mn^{2+}$.

Figure 1:
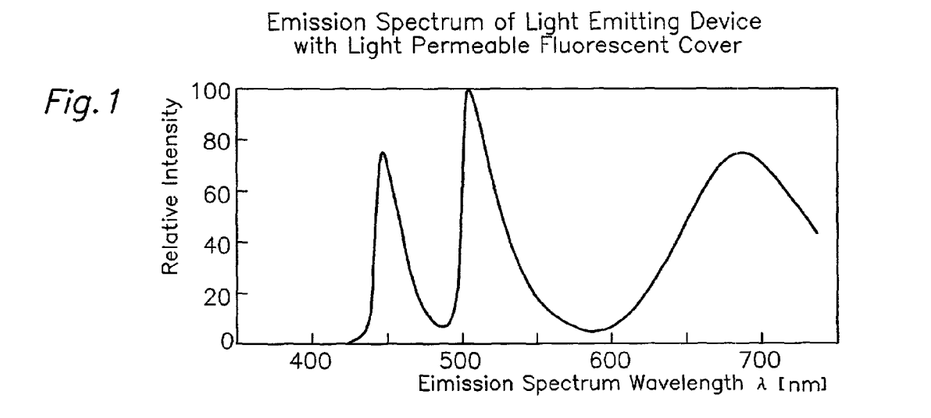
FIG. 1 is a graph of relative intensity of light irradiated from an LED with a light permeable fluorescent cover according to the present invention relative to emission spectrum wavelength.

Firstly, the fluorescent cover according to the present invention is characterized by producing blue, green and red lights of independent three primary color emission spectra like a cold cathode fluorescent tube. As shown in FIG. 1, the device according to the present invention indicates three emission spectra in three different emission wavelength bands which comprises blue light of central peak 450 nm irradiated from blue LED, green and red lights of respectively 517 nm and 690 nm converted in wavelength from blue light at and emitted from lanthanoid aluminate-manganese fluorescent material 7. Accordingly, unlike emission spectra shown in FIG. 13 of prior art light emitting device, FIG. 1 demonstrates emission spectra similar to those of cold cathode fluorescent tube shown in FIG. 14 well in harmonization with transmission spectra of transmission color liquid crystal display shown in FIG. 15.

Fluorescent material 7 preferably comprises at least one of fluorescent lanthanoid aluminates activated with manganese as shown by at least one selected from chemical formulae: $LaAl_{11}O_{18}:Mn^{2+}$; $La_2O_3 11Al_2O_3:Mn^{2+}$; $La_{1-x}Al_{11(2/3)+x}O_{19}:Mn^{2+}{}_x (0.1 \leq X \leq 0.99)$; $(La, Ce)Al_{11}O_{19}:Mn^{2+}$; and $(La, Ce)MgAl_{11}O_{19}:Mn^{2+}$.

Fluorescent cover 6 comprises a base material formed of a plastic material and fluorescent lanthanoid aluminate-manganese powder contained therein. Preferable plastic material for base material may include one or more resins selected from the group consisting of silicone, polyester, acrylic, epoxy, urethane, nylon, polyamide, polyimide, vinyl chloride, polycarbonate, polyethylene, Teflon, polystyrene, polypropylene and polyolefin. Specifically, fluorescent powder is blended in a plastic melt which is then formed or injected into a shape to attach cover 6 on an encapsulant 5 of an LED by a molding process such as transfer molding or a potting process. In this case, if base material is made of elastic resin selected from silicone, vinyl chloride and polyimide, fluorescent cover 6 may have a suitable elasticity to easily attach it on encapsulant 5, and is effective to keep cover 6 in close and clinging contact to encapsulant 5, preventing cover 6 from coming off encapsulant 5 under external force or vibration applied to cover 6. Alternatively, fluorescent cover 6 may be bonded to encapsulant 5 with a light permeable adhesive agent. Also, base material may be formed of a thermally shrinkable plastic material to firmly attach cover 6 on encapsulant 5 by thermal shrinkage after heating and cooling cover 6. On the other hand, after preparation of plastic melt blended with fluorescent powder, fluorescent cover 6 may be directly formed on encapsulant 5 by spraying plastic melt or dipping LED in plastic melt. The fluorescent cover 6 may be formed with entirely flat thickness or partially varied thickness.

Generally, LED chip 3 comprises a substrate or ceramic base plate such as silicon carbide (SiC) or sapphire, and a semiconductor layer of gallium nitride such as GaN, InGaN and InGaAlN formed on substrate by a single crystal or epitaxial growth process. The chip 3 is secured on a bottom surface of concavity 1$a$ formed on first conductor 1 by an electrically conductive adhesive, and an electrode on chip 3 is electrically connected through a lead wire 4 to a top of second conductor 2 by a wire bonding process. Finally, each upper portion of conductors 1 and 2, chip 3 and lead wire 4 are encapsulated or sealed by a light permeable organic resin such as epoxy resin to form a plastic encapsulant 5 of generally cannonball-shape so that chip 3 produces blue light with peak wavelength between 420 nm and 480 nm to outside of encapsulant 5.

There is a known $La_2O_3 11Al_2O_3:Mn^{2+}, Eu^{2+}$ fluorescent material with emission mechanism wherein it is excited by cooperative activation by divalent manganic ion $Mn^{2+}$ and europium ion $Eu^{2+}$ under ultraviolet light. Specifically, divalent europium ion $Eu^{2+}$ is excited by ultraviolet light to supply excited energy to manganic ion $Mn^{2+}$ that irradiates a light, on the contrary, the inventors have found that, when efficiently excited by irradiation of blue light, $La_2O_3 11Al_2O_3:Mn^{2+}$ fluorescent material without europium generates green and red lights in two different emission wavelength bands or ranges by adjusting manganic content.

Figure 2:
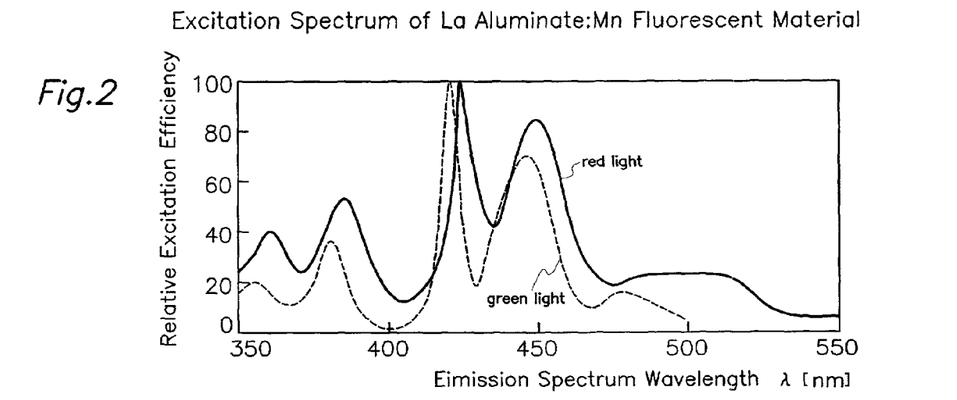
FIG. 2 is a graph showing relative excitation efficiency of light that excites a lanthanoid aluminate-manganese fluorescent material relative to excitation spectrum wavelength.
Figure 3:
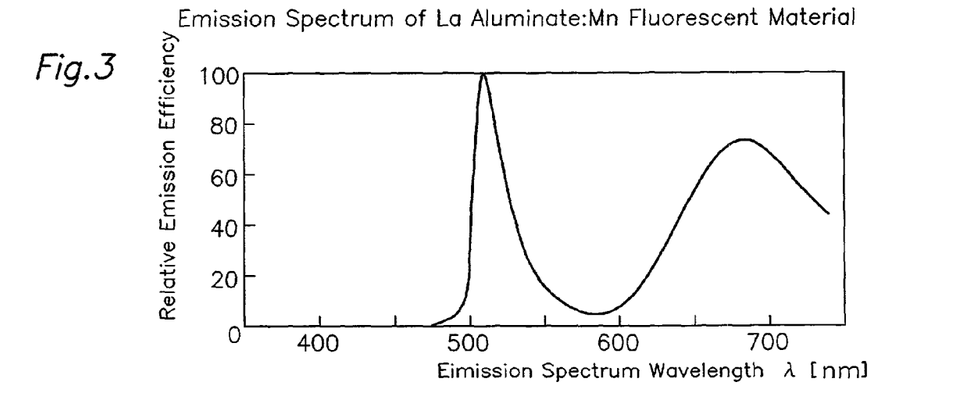
FIG. 3 is a graph showing relative emission efficiency of the lanthanoid aluminate-manganese fluorescent material relative to excitation spectrum wavelength.

Divalent manganic ion ($Mn^{2+}$) serves as an activator for lanthanoid aluminate-manganese fluorescent material and has property to generate a plurality of emission wavelength bands when a matrix of fluorescent material includes different locations of divalent manganic ion ($Mn^{2+}$) because emission wavelength of divalent manganic ion ($Mn^{2+}$) is very susceptible to crystal field size of matrix. Lanthanoid aluminate forms a matrix in spinel structure wherein divalent manganic ion ($Mn^{2+}$) bears four and six coordinations to respectively generate green and red lights with wavelength peaks of 517 nm and 690 nm while lanthanoid aluminate is efficiently excited in blue range around 450 nm. FIGS. 2 and 3 show respectively excitation and emission spectra of lanthanoid aluminate-manganese fluorescent material.

Figure 4:
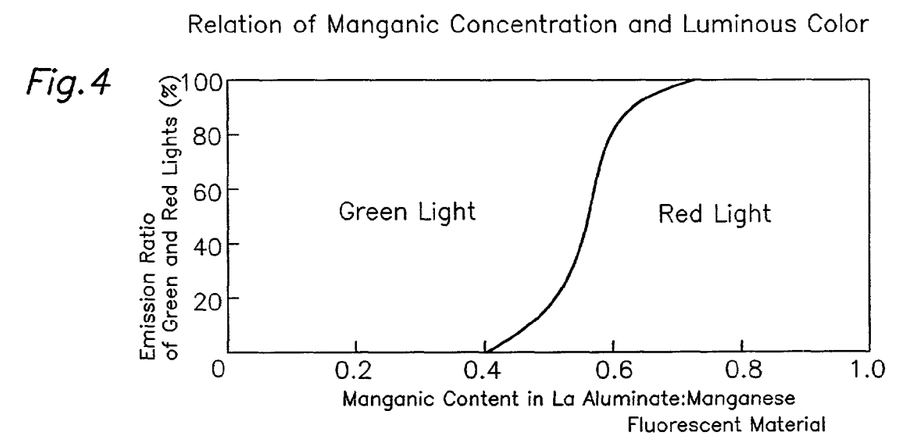
FIG. 4 is a graph showing emission ratio of green and red lights with manganic content in lanthanoid aluminate-manganese fluorescent material.

Emission proportion of green and red lights is determined depending on manganic content. FIG. 4 shows emission ratio of green and red lights with varied manganic content ratio in fluorescent material wherein it generates only green light with less than 0.4 manganic content ratio, green and red lights with 0.4 to 0.8 manganic content ratio in transition range and only red light with more than 0.8 manganic content ratio. Accordingly, lights of various luminous colors can selectively be produced in a wider light-emittable green and red areas by adjusting manganic concentration in fluorescent material of lanthanoid aluminate-manganese. The fluorescent material 7 includes fluorescent lanthanoid aluminates activated by manganese to produce green and red lights with different manganic concentrations of same components.

Thus, combination of blue LED and lanthanoid aluminate-manganese can attain a light emitting device that produces blue, green and red lights of optical three primary colors in respectively different wavelengths with an adjustable colorific tone, when blue light excites lanthanoid aluminate-manganese to generate green and red lights in simple optical mechanism.

The present invention should not be interpreted as limited to fluorescent lanthanoid aluminate-manganese that indicates only an example of matrixes in fluorescent materials. It should be understood that the generic term "lanthanoid aluminate" used in this specification, means aluminate of lanthanoids i.e. oxides of lanthanoid and aluminum for forming a matrix for fluorescent material.

Available lanthanoids known as "rare earth elements" contain lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu).

In an embodiment according to the present invention, fluorescent matrix may contain an aluminate or aluminates of a single lanthaniod element or plural lanthanoid elements as well as lantern (La) to regulate emission wavelength of green and red lights under controlled wavelength of excitation light for fluorescent material, thereby causing a wide variation of colorific tone in light sent off from LED in embodiments of the present invention. Also, activators other than manganese can be added to fluorescent material to improve property to temperature and emission efficiency of LED.

Figure 5:
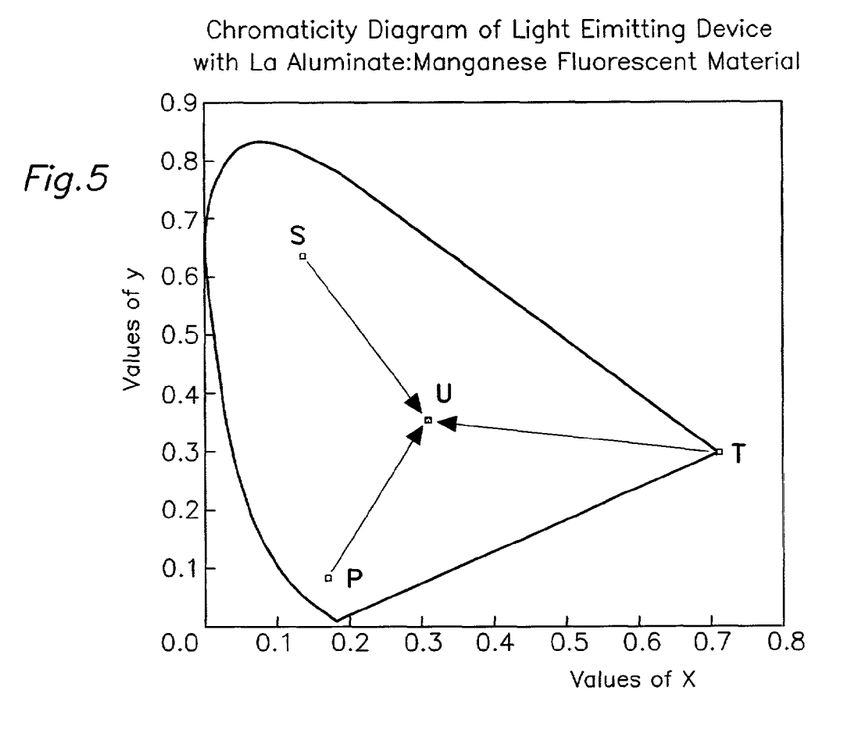
FIG. 5 is a chromaticity diagram of lights irradiated from the present invention's light permeable fluorescent cover attached on an LED.

As shown in FIG. 4, content ratio or mixture proportion of green and red lights is freely adjustable in lanthanoid aluminate-manganese fluorescent material contained in the cover according to the present invention by controlling manganic content. When LED irradiates blue light to produce green and red lights from fluorescent material upon excitation thereof by blue light, blue, green and red lights can be emanated from the cover attached on LED with selectively adjusted mixture ratio or desired combination balance of three primary color lights, and therefore, the device can produce a whitish light or white light to outside as a result of mixing three light colors. Consequently, LED in embodiments of the present invention can preferably be used as a backlighting device for a transmission color liquid crystal display. FIG. 5 shows a chromaticity diagram of lights irradiated from light permeable fluorescent cover according to the present invention when it is attached on LED wherein a synthesized light is contained in an extended area P-T-S-P.

Secondly, fluorescent cover according to the present invention is featured that LED capped with the cover can provide a display screen with colorific tone or balance similar to external light by adjusting content ratio of components in fluorescent material 7. Lanthanoid aluminate-manganese contained in cover according to the instant invention produces emission spectra that extend over deep red area above 690 nm wavelength as shown in FIG. 3 unlike emission spectra of prior art YAG:Ce fluorescent material as shown in FIG. 12.

Also, as shown in FIG. 4, content ratio of emitted green and red lights can be adjusted as required by controlling manganic concentration in lanthanoid aluminate-manganese fluorescent material so that LED can be preferably used as a supplementary light source for reflection color liquid crystal display because it can provide colorific tone or balance similar to external light as sunlight.

Thirdly, the cover according to the present invention is advantageous in that it does not exhaust watcher's eyes through his or her visual activity for a long time because emission spectra of LED with the cover according to the present invention contain spectra of blue, green and red lights in no optically complementary color relation to each other. On the contrary, prior art light emitting device shown in FIG.

13 produces blue and yellow lights in optically complementary color relation to each other that makes watcher's eyes tired.

Figure 6:
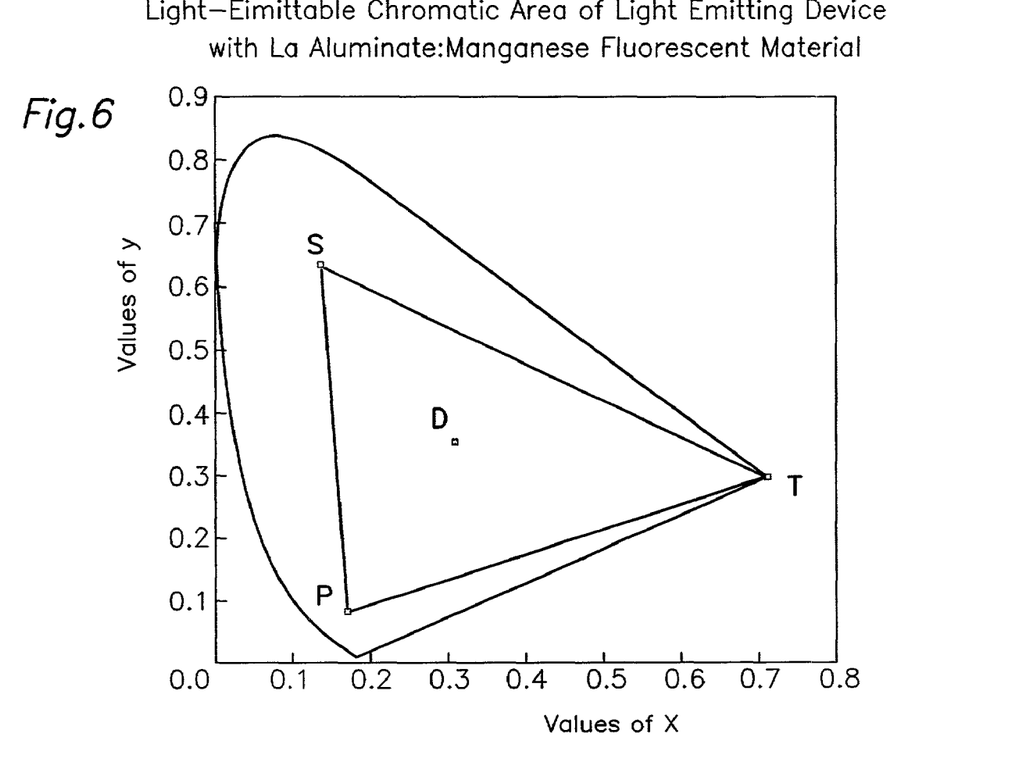
FIG. 6 is a chromaticity diagram indicating a light-emittable chromatic area of an LED capped with a light permeable fluorescent cover according to the present invention.

A forth feature of LED with the cover according to the present invention is that it can produce mixed color lights in an extremely large area in chromaticity diagram as shown in FIG. 6 with various color tones from combination of blue, green and red lights. It is understood that light-emittable chromatic area P-T-S-P shown in FIG. 6 is much greater than that P-$Q_1$ to $Q_5$-P of prior art light emitting device shown in FIG. 17. Accordingly, the cover of the invention can be preferably applied to show colorful expressions with various colorific tones.

Figure 7:
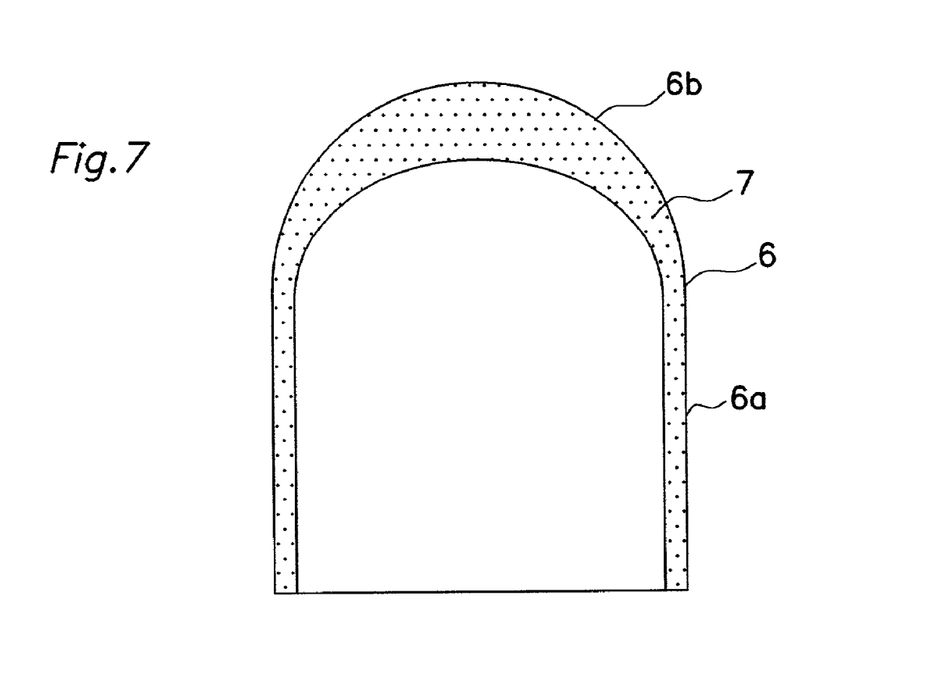
FIG. 7 is a sectional view of a second embodiment showing a light permeable fluorescent cover according to the present invention.

Generally, LED has its directivity of emitted light wherein light intensity is varied depending on a beam spread angle, and in some case, luminous color is disadvantageously irregular between high and low light intensity directions when a light permeable fluorescent cover with an entirely same thickness is attached on LED. To solve the problem, thickness of cover may be varied along light intensity distribution of LED such that cover is thicker with stronger light intensity area and thinner with weaker light intensity area to provide uniform light color throughout whole irradiation angle. FIG. 7 shows a second embodiment of light permeable fluorescent cover according to the present invention wherein the cover is applied to LED of cannonball-shaped encapsulant 5 that has a varied light intensity with the strongest light intensity at a top of lens-shaped spherical portion 5b of encapsulant 5 and with continuously decreased light intensity toward cylindrical portion 5a of encapsulant 5. In this embodiment, the cover has its varied thickness in accordance with change in light intensity of cannonboll-shaped LED such that the cover is thickest at the top portion and continuously thinner toward cylindrical portion 5a of encapsulant 5 to provide uniform light color throughout the irradiation angle.

Figure 8:
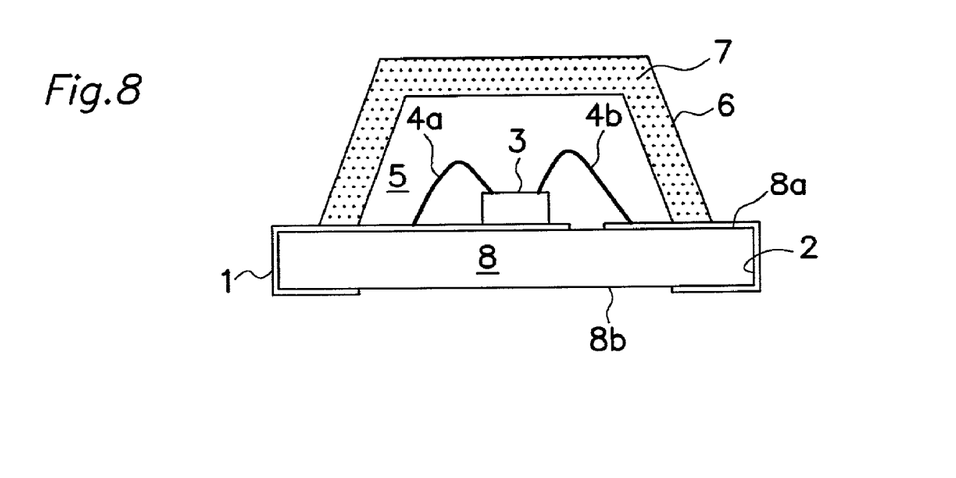
FIG. 8 is a sectional view of a third embodiment showing a light permeable fluorescent cover according to the present invention.

FIG. 8 shows a third embodiment of a light permeable fluorescent cover according to the present invention applied to a super small LED for surface-mounted type referred to as a chip LED. LED shown in FIG. 8 comprises an insulating base plate 8; a pair of conductors 1, 2 attached to base plate 8 and extending from an upper side 8a to a bottom side 8b of base plate 8; an LED chip 3 as blue LED bonded on an end of conductor 1 by adhesive; a pair of lead wires 4a, 4b connected between electrodes of LED chip 3 and conductors 1, 2; and an encapsulant 5 formed of for example, epoxy resin on the one side 8a of base plate 8 by injection molding for encapsulating LED chip 3, lead wires 4a, 4b and inner ends of conductors 1, 2. In this embodiment, light permeable cover 6 is bonded on encapsulant 5 by light permeable adhesive because cover 6 does not have the configuration capable of clinging on encapsulant 5 itself. Alternatively, the cover 6 may directly be formed on encapsulant 5 by spraying or dipping in plastic melt.

The light permeable fluorescent cover 6 according to the present invention may be applied to an LED with an LED chip of a light emitting gallium nitride layer on an electrically conductive SiC substrate as shown in FIG. 10 or on an insulating sapphire substrate as shown in FIG. 8. However, the present invention is not limited to the above mentioned materials and structures, and is applicable to LED chips of any structure if light generated from the chip can be converted into two different wavelength areas.

As mentioned above, the cover according to the present invention has the superior functions that can overcome many problems arising in prior art light emitting device with blue LED and YAG:Ce fluorescent material 7. The cover of the present invention can be applied to a semiconductor light emitting device, in particular, for emitting white light that has various superior features: higher mechanical shock resistance, operability without high voltage to be applied, less power consumption, less amount of generated heat. Also, the cover is very advantageous in that it is eco-friendly without producing incidental high frequency noise or use of mercury as compared with incandescent lamps, and hot and cold cathode fluorescent tubes of prior art bulb type white light sources.

The light emitting device with the light permeable fluorescent cover according to the present invention is very advantageous since it can adjust at will combined colorific tone of blue light from blue LED, green and red lights from the fluorescent material, keeping a predetermined desired chromatic balance close to external light on display screen. As the light emitting device can mix three color lights into a white light to be irradiated to outside, it can be preferably used as backlight for transmission color liquid crystal display. Also, the light emitting device is very advantageous since it can synthesize lights in a wide chromaticity area by mixing three primary blue, green and red lights to irradiate them to outside in colorful expression. The light emitting device does not tire watcher's eyes through his or her visual activity for a long time because generated lights are in no optically complementary color relation to each other, and therefore, it may be preferably utilized as a general light source or supplementary light source for reflection color liquid crystal display, expected to be a solid-state white light source of next generation. The light permeable fluorescent cover can be made in simple structure at reduced cost for mass production with good quality.

The foregoing embodiments of the present invention may be changed in various ways. For example, the cover may contain a fluorescent material or mixed fluorescent materials for converting red or green light shed from LED into blue and green lights or blue and red lights to provide a synthesized light from three primary color lights. Alternatively, the cover may contain a fluorescent material or mixed fluorescent materials for converting a selected first light shed from LED into more than three second, third and fourth lights wherein the first light has a first peak in a first wavelength range; the second light has a second peak in a second wavelength range away from the first peak, the third light has a third peak in a third wavelength range away from the first and second peaks and the fourth light has a fourth peak in a fourth wavelength range away from the first, second and third peaks to synthesize a new light by mixture of the first, second, third and fourth lights.

What is claimed is:

1. A light permeable fluorescent cover to be attached on a light emitting diode which emits a blue light having a first peak in a blue wavelength range, said cover comprising a fluorescent material for producing green and red lights upon excitation by said blue light, said green light having a second peak in a green wavelength range away from said first peak, and said red light having a third peak in a red wavelength range away from said first and second peaks, wherein said blue, green and red lights are mixed into a whitish or white light to be irradiated to outside of said cover, said fluorescent material comprises at least one of fluorescent lanthanoid aluminates activated with manganese shown by at least one selected from chemical formulae: $LaAl_{11}O_{18}:Mn^{2+}$, $La_2O_3 11Al_2O_3:Mn^{2+}$, $La_{1-x}$ $Al_{11(2/3)+X}O_{19}:Mn^{2+}{}_X$ ($0.1 \leqq X \leqq 0.99$), $(La, Ce)Al_{11}O_{19}:Mn^{2+}$, and $(La, Ce)MgAl_{11}O_{19}:Mn^{2+}$, and said fluorescent material has 0.4 to 0.8 manganic content ratio for adjusting component ratio of said green and red lights in said whitish or white light.

2. A light permeable fluorescent cover of claim 1, wherein said first peak is from 420 nm to 480 nm; said second peak is from 490 nm to 550 nm; and said third peak is from 660 nm to 720 nm.

3. A light permeable fluorescent cover of claim 1, wherein said cover comprises a base material formed of one or more resins selected from the group consisting of silicone, polyester, acrylic acid, epoxy, urethane, nylon, polyamide, polyimide, vinyl chloride, polycarbonate, polyethylene, Teflon, polystyrene, polypropylene and polyolefin.

4. A light permeable fluorescent cover of claim 1, wherein said cover has a varied thickness along emission intensity distribution of said light emitting diode.

5. A light permeable fluorescent cover of claim 1, wherein said cover is attached on and in close and clinging contact to said light emitting diode.

6. A light permeable fluorescent cover of claim 1, wherein said cover is thermally shrinkable.

7. A light permeable fluorescent cover of claim 1, wherein a light permeable adhesive agent adheres said cover to said light emitting diode.

8. A light permeable fluorescent cover of claim 1, wherein said light emitting diode is used in a backlighting device for a transmission color liquid crystal display or supplementary light source for reflection color liquid crystal display.

* * * * *